United States Patent [19]

French

[11] Patent Number: 5,510,753

[45] Date of Patent: Apr. 23, 1996

[54] COMPOSITE BRIDGE AMPLIFIER WITH OUTPUT OVERLOAD AND THERMAL PROTECTION

[75] Inventor: John B. French, Stouffville, Canada

[73] Assignee: Blade Technologies Inc., Markham, Canada

[21] Appl. No.: 345,728

[22] Filed: Nov. 22, 1994

[30] Foreign Application Priority Data

Nov. 23, 1993 [CA] Canada ................................. 2109755

[51] Int. Cl.⁶ ...................................................... H03F 3/217
[52] U.S. Cl. ........................... 330/146; 330/10; 330/251;
330/289; 330/297; 330/298
[58] Field of Search ............................ 330/10, 146, 202,
330/207 A, 207 P, 251, 289, 297, 298;
361/87, 103, 106

[56] References Cited

U.S. PATENT DOCUMENTS

| 3,829,788 | 8/1974 | Ford | 330/10 |
|---|---|---|---|
| 4,016,501 | 4/1977 | Jasinski et al. | 330/10 |
| 4,949,050 | 8/1990 | Swanson | 330/146 X |
| 5,075,634 | 12/1991 | French | 330/146 |

*Primary Examiner*—James B. Mullins

*Attorney, Agent, or Firm*—Bereskin & Parr

[57] ABSTRACT

A composite bridge amplifier has four output transistors in a bridge configuration. The transistor control terminals (gates or bases) are controlled by an input signal which is amplified in a phase splitter and voltage gain stage. The output terminals of the transistors receive a power signal which varies with the input signal at a level sufficient to maintain headroom above the output signal but to reduce power dissipation in the transistors. The power signal is produced by a switch connected between a floating power supply and a filter and operated at e.g. 200 kHz. The switch is operated by a pulse width modulated (pwm) signal derived from the absolute value of the input signal. A proportional integral controller is coupled between the filter output and the pulse width modulator for closed loop feedback. The output is aligned with the input signal by a phase shifter connected to the controller. Since there is no time delay in the input signal (i.e. audio) path, high performance is achieved at reduced cost. For improved high frequency performance, the amplifier includes a peak detector circuit for tracking a high frequency input signal and compensating the pwm signal. The amplifier also features thermal overload protection and output current overload protection circuits which protect the output stage by reducing the headroom. Because the protection circuits do not "clip" the output signal, the effect to the listener is minimized.

20 Claims, 5 Drawing Sheets

COMPOSITE BRIDGE AMPLIFIER WITH OUTPUT OVERLOAD AND THERMAL PROTECTION

FIELD OF THE INVENTION

The present invention relates to an amplifier. More particularly, the present invention relates to an improved composite bridge amplifier.

BACKGROUND OF THE INVENTION

A composite bridge amplifier is disclosed in U.S. Pat. No. 5,075,634. The amplifier comprises the series combination of a single-ended Class D amplifier and a linear Class AB bridge amplifier. The output of the Class D amplifier provides the supply voltage for the bridge amplifier. The signal to be amplified, e.g. an audio signal, varies the supply voltage to the bridge amplifier which produces a small and constant voltage drop across the output transistors in the bridge amplifier. This results in greatly reduced power dissipation in the output transistors, while providing Class AB type performance.

A feature of the amplifier disclosed in U.S. Pat. No. 5,075,634 is that the combination of bridge amplifier and Class D amplifier only requires a single-ended Class D amplifier. It will be appreciated that this can greatly reduce the cost of the amplifier. The Class D amplifier includes a pulse width modulator stage which controls the supply voltage to the bridge amplifier. The pulse width modulator (or pwm) stage comprises a pulse width modulator, a switch and a pwm filter. The power supply is coupled to the input of the pwm filter through the switch which is controlled by the pulse width modulator. In the prior art amplifier, the control of the pulse width modulator comprises an open-loop system. A reference signal corresponding to the absolute value or full-wave rectified input audio signal is used to directly control or establish the pulse width for the pulse width modulator. In order to align the output of the pulse width modulator with the bridge audio signal, a time delay is needed.

The purpose of the time delay is to align or synchronize the output from the pulse width modulator stage with the bridge amplifier. There is lag between the supply voltage signal to the bridge and the audio signal input to the bridge due primarily to the reactance in the pwm filter. In the prior art amplifier, the supply signal and input signal were aligned by a time delay placed in the bridge audio signal path. Because the time delay is in the audio signal path, it must comprise a high quality circuit in order to maintain the high performance specifications for the amplifier. In practice, this usually means a digital implementation in order to provide high bandwidth and low distortion, which can add considerable expense to the cost of the amplifier.

The open loop control of the pulse width modulator stage in the prior art amplifier can affect the performance of the amplifier in other ways. Variations in the pwm filter, for example, due to the finite resistance of the switch and the reactive characteristics of the components in the filter, can cause error and distortion in the output from the pulse width modulator stage. Because the Class D amplifier provides the supply voltage for the bridge amplifier, distortion or error in the output from the pulse width modulator stage can lead to distortion and error in the bridge amplifier.

Another problem associated with the open-loop implementation for the pulse width modulator is the susceptibility to noise in the power supply. Since the power supply is connected (through the switch) to the pwm filter, any audio frequency noise on the supply will be coupled to the filter.

While the composite bridge amplifier disclosed in U.S. Pat. No. 5,075,634 provides a novel amplifier in which high efficiency can be achieved with less cost than known amplifiers, there is still a need for an improved composite bridge amplifier.

BRIEF SUMMARY OF THE PRESENT INVENTION

Accordingly, it is an object of the present invention to provide an improved composite bridge amplifier.

One of the features of the improved composite bridge amplifier is a closed loop control system for the pulse width modulator stage. The control system according to the invention improves the performance of the amplifier. In addition, the control system eliminates the need for the time delay. Eliminating the time delay, in turn, can reduce the cost of the amplifier.

Other features of the improved composite bridge amplifier include current overload protection and thermal overload protection for the output stage.

In a first aspect, the present invention provides an amplifier for amplifying an input signal, said amplifier comprising: (a) first, second, third and fourth amplifier means each having first and second power terminals and a control terminal; (b) said amplifier means being connected in a bridge configuration, said first and second amplifier means each having their first power terminals coupled together and to a first power input terminal, said third and fourth amplifier means each having their first power terminals coupled together and to a second power input terminal; (c) the second power terminals of said first and third amplifier means being coupled together and to a first output terminal, the second power terminals of said second and fourth amplifier means being coupled together and to a second output terminal, said first and second output terminals being adapted to being connected to a load; (d) an input terminal for said input signal, and a control circuit coupled between said input terminal and said control terminals of said first to fourth amplifier means to operate alternately said first and third amplifier means and then said second and fourth amplifier means, to direct current from said first power input terminal through said first amplifier means, said first output terminal, said load, said second output terminal, said forth amplifier means and said second power input terminal, and then to direct current from said first power input terminal through said second amplifier means, said second output terminal, said load, said first output terminal, said third amplifier means and said second power input terminal; (e) modulating means coupled to said input terminal for producing a modulated signal having modulation dependent on said input signal; (f) power supply means, and filter means for said power supply means; (g) switch means having a control input, said switch means coupling said power supply means to said filter means, said filter means being coupled to said first and second power input terminals; (h) said modulating means being coupled to said control input of said switch means for controlling said switch means to produce at said power input terminals a power signal dependent on said input signal; and (i) said modulating means including means for producing a power control signal for controlling said switch means and phase shifter means for phase shifting said power control signal so that said power signal is shifted for alignment with said input signal.

In another aspect, the present invention provides an amplifier for amplifying an input signal, said amplifier comprising: (a) first, second, third and fourth amplifier means each having first and second power terminals and a control terminal; (b) said amplifier means being connected in a bridge configuration, said first and second amplifier means each having their first power terminals coupled together and to a first power input terminal, said third and fourth amplifier means each having their first power terminals coupled together and to a second power input terminal; (c) the second power terminals of said first and third amplifier means being coupled together and to a first output terminal, the second power terminals of said second and fourth amplifier means being coupled together and to a second output terminal, said first and second output terminals being adapted to being connected to a load; (d) an input terminal for said input signal, and a control circuit coupled between said input terminal and said control terminals of said first to fourth amplifier means to operate alternately said first and third amplifier means and then said second and fourth amplifier means, to direct current from said first power input terminal through said first amplifier means, said first output terminal, said load, said second output terminal, said fourth amplifier means and said second power input terminal, and then to direct current from said first power input terminal through said second amplifier means, said second output terminal, said load, said first output terminal, said third amplifier means and said second power input terminal; (e) modulating means coupled to said input terminal for producing a modulated signal having modulation dependent on said input signal; (f) power supply means, and filter means for said power supply means; (g) switch means having a control input, said switch means coupling said power supply means to said filter means, said filter means being coupled to said first and second power input terminals; (h) said modulating means being coupled to said control input of said switch means for controlling said switch means to produce at said power input terminals a power signal dependent on said input signal; and (i) overload current protection means including sensor means coupled to one of said amplifier means for sensing the current flowing in said amplifier means, said sensor means comprising averaging means for producing an output signal corresponding to the average value of said sensed current and peak detector means for producing an output signal corresponding to the peak value for said sensed current, and said averaging means including threshold means for producing a current overload signal when said averaged output signal exceeds a first pre-determined threshold, and said peak detector means including threshold means for producing a current overload signal when said peak output signal exceeds a second pre-determined threshold, and divider means coupled to said modulating means for proportionately reducing said power control signal in response to said current overload signal.

In yet another aspect, the present invention provides an amplifier for amplifying an input signal, said amplifier comprising: (a) first, second, third and fourth amplifier means each having first and second power terminals and a control terminal; (b) said amplifier means being connected in a bridge configuration, said first and second amplifier means each having their first power terminals coupled together and to a first power input terminal, said third and fourth amplifier means each having their first power terminals coupled together and to a second power input terminal; (c) the second power terminals of said first and third amplifier means being coupled together and to a first output terminal, the second power terminals of said second and fourth amplifier means being coupled together and to a second output terminal, said first and second output terminals being adapted to being connected to a load; (d) an input terminal for said input signal, and a control circuit coupled between said input terminal and said control terminals of said first to fourth amplifier means to operate alternately said first and third amplifier means and then said second and fourth amplifier means, to direct current from said first power input terminal through said first amplifier means, said first output terminal, said load, said second output terminal, said fourth amplifier means and said second power input terminal, and then to direct current from said first power input terminal through said second amplifier means, said second output terminal, said load, said first output terminal, said third amplifier means and said second power input terminal; (e) modulating means coupled to said input terminal for producing a modulated signal having modulation dependent on said input signal; (f) power supply means, and filter means for said power supply means; (g) switch means having a control input, said switch means coupling said power supply means to said filter means, said filter means being coupled to said first and second power input terminals; (h) said modulating means being coupled to said control input of said switch means for controlling said switch means to produce at said power input terminals a power signal dependent on said input signal; and (i) thermal overload protection means having a temperature sensor coupled to one of said amplifier means and having means for producing a temperature output signal in response to a change in temperature in said amplifier means, and means coupled to said temperature sensor for producing a thermal protection signal when said temperature output signal exceeds a first pre-determined threshold, and divider means coupled to said modulating means and including means responsive to said thermal protection signal for proportionately reducing the magnitude of said power control signal.

BRIEF DESCRIPTION OF THE DRAWINGS

For a better understanding of the present invention, and to show more clearly how it may be carried into effect, reference will now be made, by way of example, to the accompanying drawings which show preferred embodiments of the present invention, and in which.

DETAILED DESCRIPTION OF THE PREFERRED EMBODIMENTS

Figure 1:
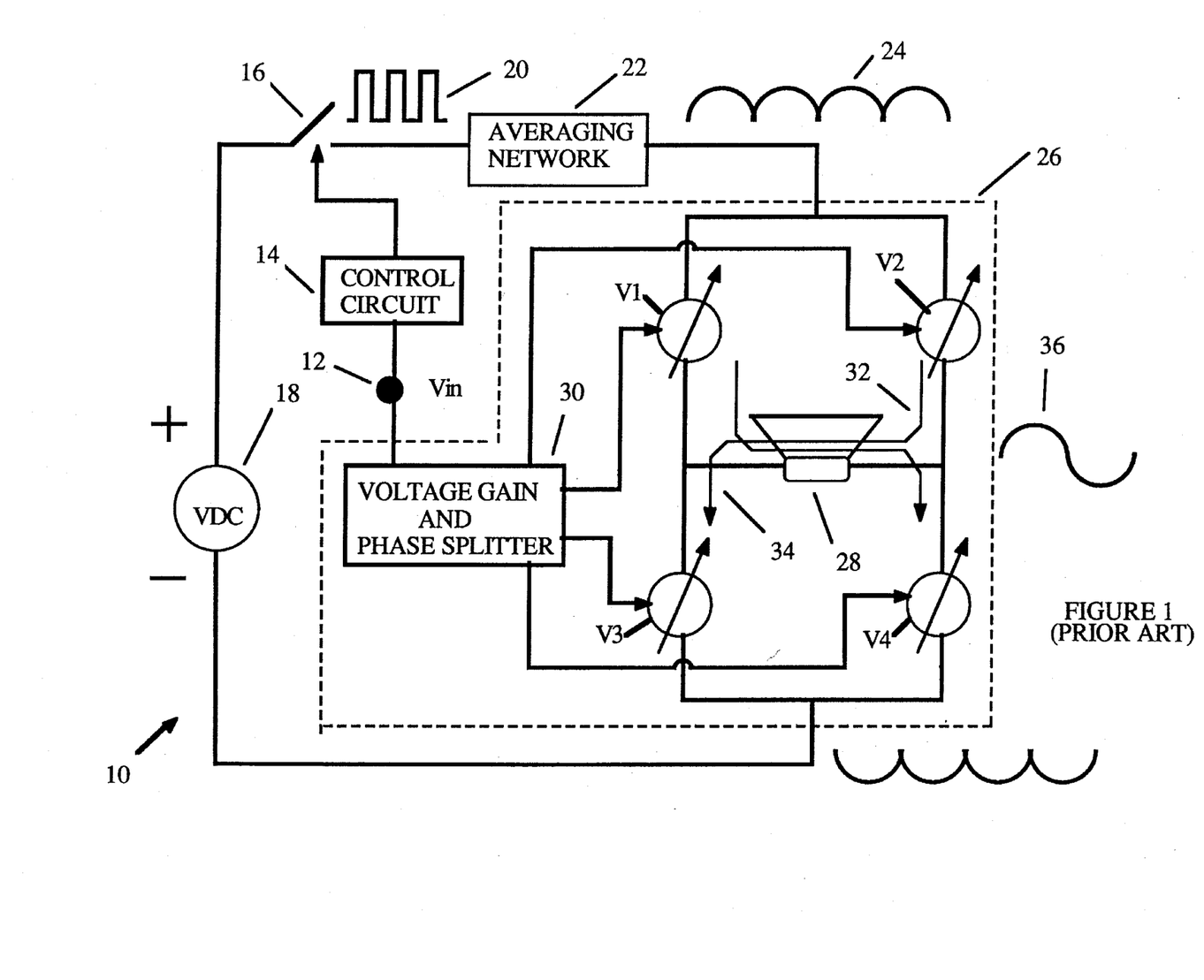
FIG. 1 is a block diagram view of a prior art composite bridge amplifier.

Reference is first made to FIG. 1, which shows a prior art composite bridge amplifier 10. The composite bridge amplifier 10 is disclosed in U.S. Pat. No. 5,075,634 and the disclosure of that patent is incorporated herein by this reference.

As shown in FIG. 1, the composite bridge amplifier 10 has an input terminal 12 for an input signal $V_{in}$, for example an audio input signal. The input signal $V_{in}$ at the terminal 12 controls a control circuit 14 which supplies a pulse width modulated (or PWM) signal (corresponding to the input signal $V_{in}$) to a switch 16. A single DC power supply 18 or $V_{DC}$ feeds its output through the switch 16, producing a pwm power signal 20 which is averaged by an averaging network or pwm filter 22. The averaging network or filter 22 produces an averaged or filtered power signal 24 which corresponds to or tracks the input signal $V_{in}$.

The averaged signal 24 is used to power a bridge amplifier 26. The bridge amplifier 26 includes four output transistors shown as controllable voltage sources $V_1, V_2, V_3, V_4$ driving a load, for example a speaker 28. While in the following description, the voltage sources $V_1, V_2, V_3, V_4$ are described using mosfet (metal-oxide semiconductor field effect transistors), bi-polar junction transistors can also be used as will be understood by one skilled in the art. The bridge amplifier 26 is controlled by the input signal $V_{in}$, which is phase split and preamplified by a voltage gain and phase splitter stage 30 (forming part of the bridge amplifier 26) and then directed to sources $V_1$ to $V_4$. The bridge amplifier 26 is essentially two push-pull amplifiers driven 180 degrees out of phase from each other. On one half cycle of each signal, sources $V_1, V_4$ are on and current flows through the load 28 as indicated by arrow 32. On the other half cycle sources $V_2, V_3$ are on and current flows through the bridge 26 as indicated by arrow 34. The result is a composite output waveform through the load 28 as indicated by reference 36.

The configuration shown in FIG. 1 has the advantage that because of the polarity reversing properties of the bridge 26, only one DC power supply 18, one control circuit 14, and one pwm switch 16 are needed when compared to other known amplifiers, for example, a Class D switch mode amplifier or a push-pull composite amplifier. This considerably reduces the cost, notwithstanding the added complexity of the bridge 26. In addition, the use of the bridge 26 can have advantages in reducing distortion. Furthermore, the circuit shown in FIG. 1 can be made very compact, even for high power applications.

Figure 2:
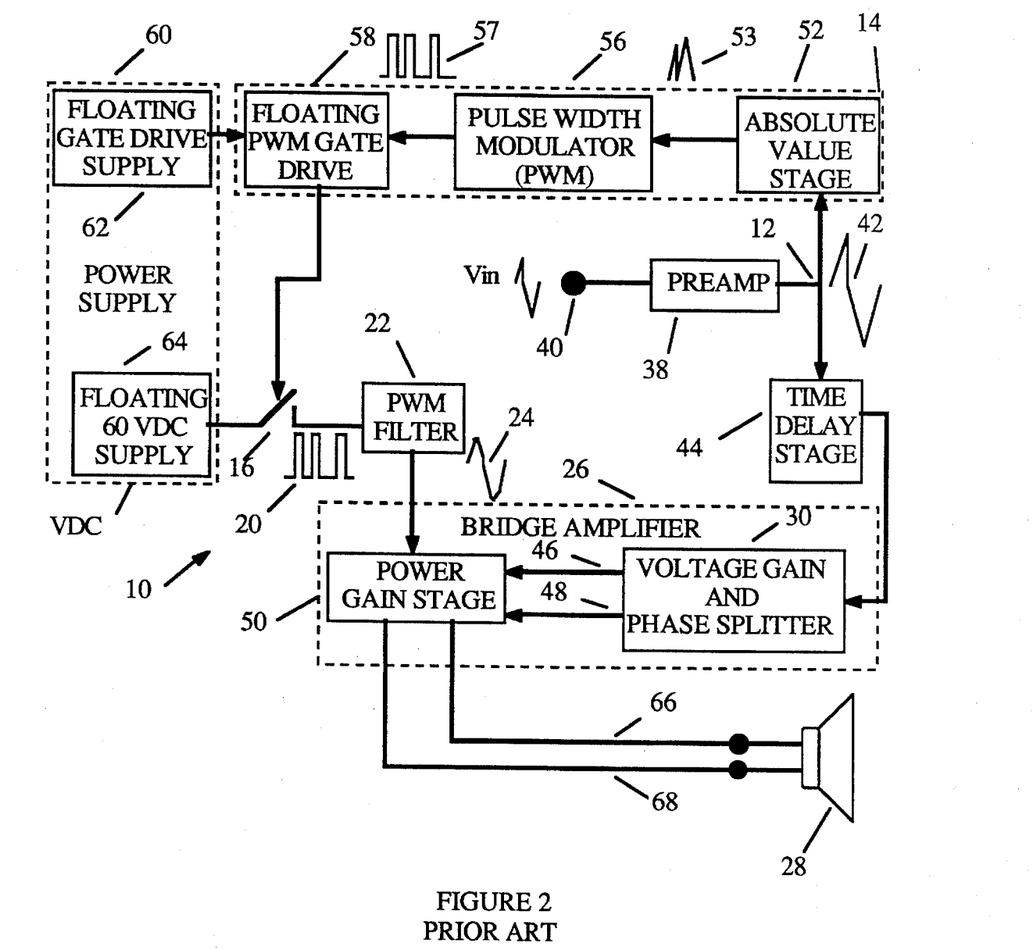
FIG. 2 is a more detailed block diagram of the prior art composite bridge amplifier of FIG. 1.

Reference is next made to FIG. 2, which shows a more detailed block diagram of the amplifier circuit 10 shown in FIG. 1. Corresponding reference numerals are used to indicate corresponding parts in FIGS. 1 and 2.

As shown in FIG. 2, the amplifier 10 includes an preamplifier 38 coupled to the input terminal 12. The preamplifier (or preamp) 38 provides an amplifier input terminal 40 for the input audio signal $V_{in}$. The input signal $V_{in}$ at amplifier input terminal 40 is processed by the preamplifier 38 to produce an output signal 42 at terminal 12 which is split at the input terminal 12 into two branches. The first branch passes the output of the preamp 38 through a time delay stage 44 (the purpose of which will be described presently). From the time delay stage 44, the signal passes to the voltage gain stage/phase splitter stage 30 where it is phase split and amplified to control the controllable voltage sources or output transistors $V_1$ to $V_4$. From the voltage gain stage 30 the split phase signal is directed via leads 46,48 to a power gain stage 50 which includes the output voltage sources the $V_1$ to $V_4$.

The other part of the preamplified signal 42 is directed to the control circuit 14. As shown in FIG. 2, the control circuit 14 includes an absolute value stage 52 which produces an absolute value signal 53 which corresponds to a fully rectified form of the input signal $V_{in}$. The absolute value signal 53 is directed to a pulse width modulator stage 56, the output of which is a pulse width modulated control signal 57 corresponding to the input signal $V_{in}$. The pwm control signal 57 is directed to a floating pwm gate drive stage 58, which operates the switch 16. Power for the pwm gate drive stage 58 is supplied by a power supply 60 having floating gate drive power supply module 62.

Referring still to FIG. 2, the switch 16 connects a floating 60 volt DC power supply 64 or $V_{DC}$ (also part of power supply 60) to the averaging network or pulse width modulator filter 22. Under the control of the pwm signal 57, the switch 16 supplies the filter 22 with a pulse width modulated power signal 20 which is proportional to the input signal $V_{in}$. The filter 22 averages the pwm power signal 20 to produce the averaged power signal 24 which supplies the power gain stage 50. The output of the power gain stage 50 appears on leads 66,68.

A feature of the system shown in FIG. 2 is that the pulse width modulator 56 causes the averaged power signal 24 (which supplies the power gain stage 50) to track the input signal $V_{in}$. This assists in realizing the principal advantage of the composite amplifier 10 of FIG. 1, namely high efficiency.

Two other advantages result from the choice of control method shown in FIG. 2. Firstly, the "headroom" for the bridge (i.e. the difference in voltage between the supply voltage to each source $V_1$ to $V_4$ and the output voltage of each device $V_1$ to $V_4$) is proportional to the output signal of the amplifier 26. This is ideal for sources $V_1$ to $V_4$, which comprise mosfet power transistors. Because of their resistive nature, mosfet transistors require headroom proportional to the current passed through them, which in the case of the bridge 26 is proportional to the output signal.

Figure 3:
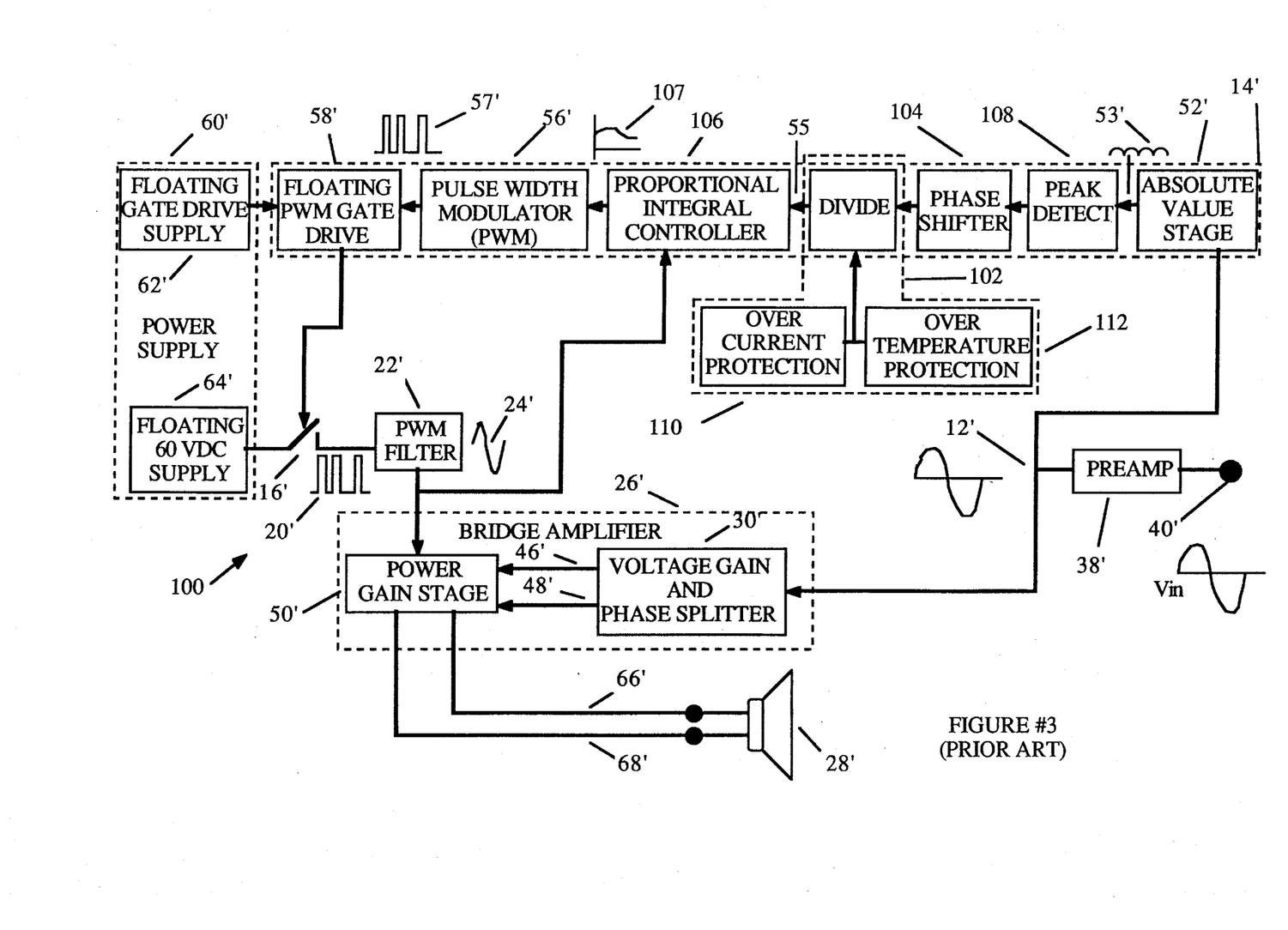
FIG. 3 is a block diagram view of an improved amplifier according to the present invention.

Reference is next to FIG. 3 which shows an improved composite bridge amplifier according to the present invention and indicated by reference 100 and represented in a form similar to that used in FIGS. 1 and 2. In FIG. 3, primed reference numerals indicate parts corresponding to those of FIGS. 1 and 2.

As shown in FIG. 3, the improved composite bridge amplifier 100 comprises an input terminal 12', a control circuit 14', a pwm switch 16', a bridge amplifier 26' and a power supply 60'. The input terminal 12' is coupled to an amplifier input 40' through a preamplifier 38'. The amplifier 100 includes two output terminals 66',68' in a power gain stage 50' which are connected to a load 28', e.g. an audio speaker.

Figure 4:
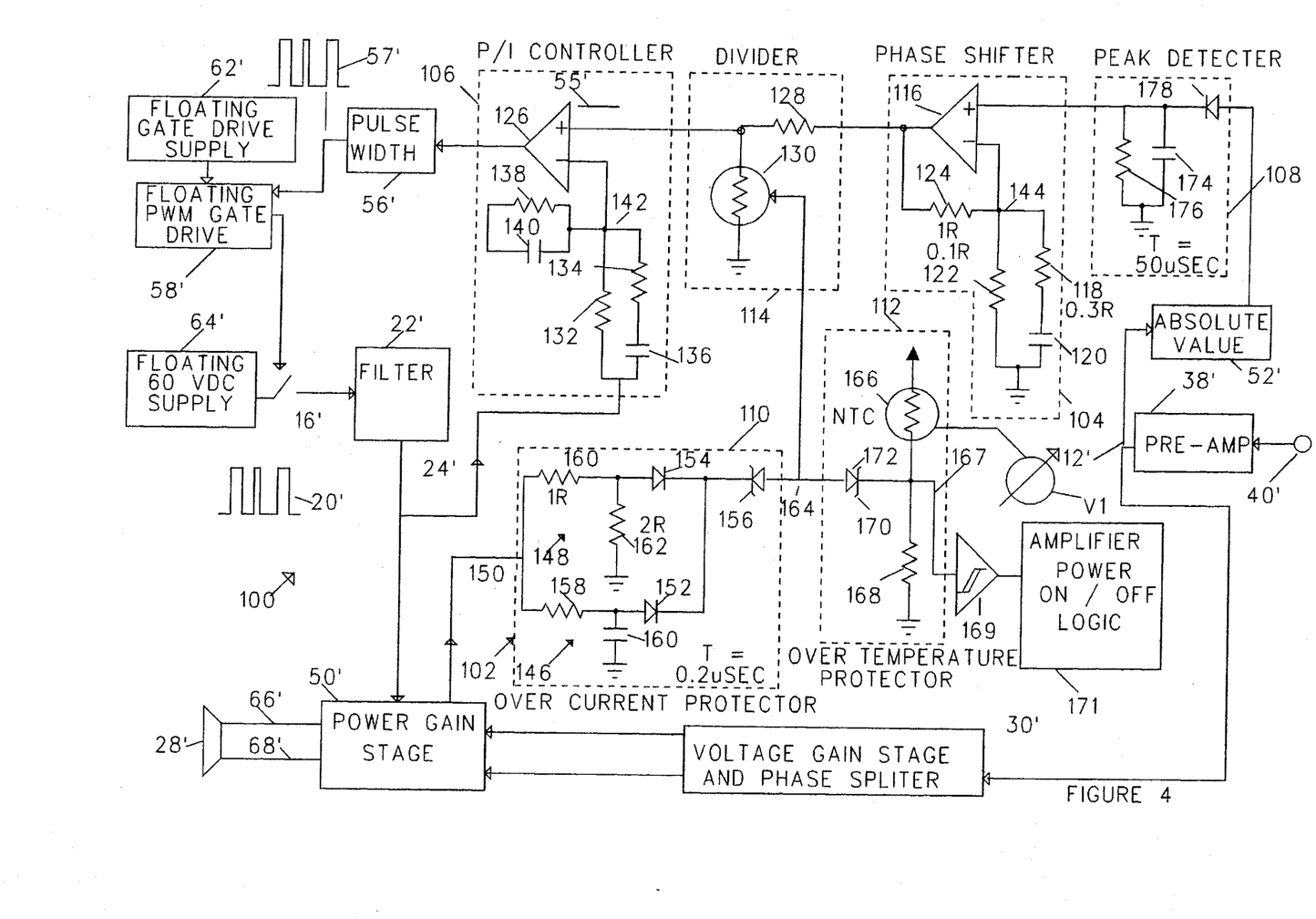
FIG. 4 is a more detailed block diagram of the amplifier shown in FIG. 3.

As shown in FIG. 3, the composite bridge amplifier 100 includes a protection circuit 102 indicated by the broken chain outline. According to the invention, the control circuit 14' also includes a pulse width modulator controller which comprises a phase shifter 104 and a proportional integral controller 106 as will be described below. The protection circuit 102 comprises an over-current protection circuit 110 and an over-temperature protection circuit 112 which are coupled to the control circuit 14' through a divider 114 as shown in FIG. 3. As will be apparent from the following description, an advantage of the improved composite bridge amplifier 100 shown in FIGS. 3 and 4 is that the time delay stage 44 (FIG. 2) is eliminated. The elimination of the time delay stage 44 leads to cost savings without sacrificing performance of the amplifier. In fact, the system shown in FIGS. 3 and 4 leads to an amplifier with much lower total harmonic distortion at high frequencies, with a reduced component count (e.g. elimination of the time delay stage 44) and an improved power supply rejection.

The operation of the pulse width modulator control circuitry, i.e. phase shifter 104 and proportional integral controller 106, will be first be described assuming that the peak detector 108 is not present.

In operation, the input signal $V_{in}$ (e.g. an audio input signal) is buffered and amplified by the preamp 38'. The preamp 38' includes inverted and non-inverting signal outputs. The preamp 38' can also include a potentiometer (not shown) to allow the gain or amplification of the preamp 38' to be set externally. The output of the preamp 38' is split and fed into the control circuit 14' (i.e. the front-end of the Class D switching amplifier) and the bridge amplifier 26'.

The signal from the preamp 38' is inverted for the negative side of the bridge amplifier 26' by the voltage gain/phase splitter stage 30'. (The operation of the bridge amplifier stage is fully described in U.S. Pat. No. 5,075,634). The inverted and non-inverted signals are amplified by high-voltage operational amplifiers (not shown) in the voltage gain stage 30'. The outputs 46',48' of the high voltage operational amplifiers are then fed through a "floating" bias circuit to the output (mosfet) transistors $V_1$ to $V_4$ (not shown in this disclosure) in the power gain stage 50'. The bridge amplifier 26' includes negative feedback which sets the gain of the stage 50' to six (6) including the doubling effect of the bridged output. The negative feedback also reduces distortion which is introduced by in the bridge amplifier 26'. The bias supplies for the output transistors $V_1$ to $V_4$ are provided by two separate "floating" (i.e. transformer isolated) power rails. The power rails are shunt regulated to produce the desired bias current (see U.S. Pat. No. 5,075,634). The bias current can be adjusted using two potentiometers.

The power gain stage 50' can also include a circuit (not shown) for radio interference, i.e. RF, filtering and impedance stabilization of the output from the bridge amplifier 26'.

The output from the preamp 38' is also fed to the control circuit 14'. The control circuit 14' forms the "front-end" for the Class D amplifier. As will be described, the primary function of the control circuit 14' is to provide a power control path for the Class D amplifier which supplies the power to the gain stage 50'. The inverted and noninverted outputs from the preamp 38' are "diode-or'd" by the absolute value stage 52' to produce the absolute value signal 53' which corresponds the full-wave rectified input signal $V_{in}$. The absolute value signal 53' provides a reference signal 55 which is fed into the proportional integral controller 106 to control the pulse width produced by the pulse width modulator 56'. As will be described below, the reference signal 55 can be attenuated by the protection circuit 102 in order to protect the power gain stage 50' against damage from overload conditions.

Referring still to FIG. 3, the absolute value signal 53' is fed into the phase shifter 104. The function of the phase shifter 104 is to align the output of the pwm filter 22' with the audio signal being fed into the bridge amplifier stage 26'. As will be described with reference to FIG. 4 below, the phase shifter 104 produces two components which together comprise the reference signal 55. The first component comprises the absolute value signal 53' (i.e. the rectified audio signal) and the second component comprises a derivative of the absolute value signal 53'.

The proportional integral controller 106 compares the reference signal 55 to the output of pwm filter 22' (i.e. the output of the Class D amplifier) and produces an error signal 107. The error signal 107 provides the input to the pulse width modulator 56'. The pulse width modulator 56' compares the error signal 107 to a triangular wave to produce the pulse-width modulated control signal 57' which controls the switch 16' through the floating pwm drive stage 58'. The floating drive stage 58' includes an optic coupler (not shown) for isolating the pulse-width modulated control signal 57'.

The supply voltage to the output transistors $V_1$ to $V_4$ is gated by the switch 16' to produce the pulse width modulated power signal 20'. The audio signal component is recovered from the pulse width modulated power signal 20' by the pwm filter 22' in the form of an averaged power signal 24' which is directed to the power gain stage 50'. The pwm filter 22' comprises a low pass LC filter. To maintain stability, the proportional integral controller 106 includes phase lead and lag compensation circuitry as will be described below.

The protection circuit 102 provides protection against overload current and over-temperature in the output transistors $V_1$ to $V_4$ in the power gain stage 50'. In operation, the over-current protection circuit 110 senses the output current in the power gain stage 50'. The sensed output current is averaged and if it exceeds a threshold value, the reference signal 55 is attenuated or reduced by the divider 114 in proportion to amount that the threshold level is exceeded. This has the effect of reducing the voltage across, i.e. the voltage swing of the amplifier, the output transistors $V_1$ to $V_4$. In response to an over current condition, the voltage across the output transistors $V_1$ to $V_4$ will be reduced until they are fully saturated, and in this way the output current will never exceed a maximum controlled value.

A feature of the protection circuit 102 is that reducing the voltage swing (i.e. headroom) across the output transistors $V_1$ to $V_4$ does not involve clipping the output signal 36. Therefore, during an over-load condition the amplified output signal 36 will have less distortion than for conventional amplifiers. It should be noted that reducing the headroom in the extreme case will compress the output signal 36 to the point where it may exhibit cross-over distortion type symptoms.

The over-current protection circuit 110 also peak-detects the output current to protect against a "dead short" fault condition. As will be described with reference to FIG. 4, if a scaled value of the detected peak output current exceeds a pre-determined threshold, then the protection circuit 110 limits the output current in the transistors $V_1$ to $V_4$ by reducing the reference signal 55. This feature ensures that the peak output current is limited, and is used to provide short-circuit protection for the amplifier 100.

Referring still to FIG. 3, the over-temperature protection circuit 112 protects the output or power gain stage 50' against damage from over-heating. Over-heating can arise if the transistors $V_1$ to $V_4$ supply large output current over a sustained period of time. As will be described with reference to FIG. 4, the over-temperature protection circuit 112 comprises a thermistor which is coupled to one of the output transistors, e.g. $V_1$. When the temperature of the output transistor $V_1$ exceeds a pre-determined threshold, e.g. 90 degrees Centigrade, the over-temperature circuit 112 will reduce the reference signal 55 through the divider 114. This has the effect of reducing the voltage across the output transistors $V_1$ to $V_4$ and hence the power that they are dissipating. Once the threshold temperature is exceeded, the over-temperature circuit 112 will decrease the reference signal 55 (and output power) in proportion to the temperature increase. If the temperature reaches a pre-determined maximum value, the over-protection circuit 112 can also include logic to completely shut off the amplifier 100.

Reference is next made to FIG. 4 which shows a detailed circuit according to the invention. In the schematics, the relative component values are shown in parentheses.

The phase shifter 104 comprises an operational amplifier 116. The non-inverting input of the op amp 116 is coupled to the output of the peak detector 108. The inverting input of the op amp 116 is coupled to signal ground through a resistor 118 and capacitor 120 and another resistor 122. The inverting input is also coupled to the output of the op amp 116 through a resistor 124. The phase shifter 104 works in conjunction with the proportional integral controller 106 to phase shift the reference signal 55 thereby providing closed loop control of the pwm filter 22' while at the same time eliminating the need for the time delay stage 44 (FIG. 2).

As shown in FIG. 4, the proportional integral controller 106 comprises an operational amplifier 126. The non-inverting input of the op amp 126 is coupled to the output of the phase shifter 104 through a resistor 128. (The resistor 128 in combination with a voltage controlled resistor or VCR 130 comprises the divider 114 as will be described below.) The inverting input of the op amp 126 is coupled to the output of the pwm filter 22' through a network comprising resistors 132,134 and a capacitor 136 to form a closed loop feedback network. The resistor 134 and capacitor 136 form a "lead" network as will be understood by those skilled in the art. The inverting input is also coupled to the output of the op amp 126 through a "lag" network comprising a resistor 138 in parallel with a capacitor 140. The function of the phase lead and lag networks is to maintain stability in the closed loop feedback system as will be understood by those skilled in the art.

In operation the capacitor 136 differentiates the output of the pwm filter 22'. This signal is summed with the output of the pwm filter 22' at node 142 through resistor 132. The summed signal at node 142 is fed to the inverting input of the op amp 126 and compared to the reference signal 55 which appears on the non-inverting input of the op amp 126. The error signal 107 produced by the op amp 126 represents the difference between the signals on the inverting and non-inverting inputs. The error signal is used to control the pulse width modulator stage 56'.

One of the features of the improved amplifier 100 is that the closed loop control can provide power supply rejection. Because the proportional integral controller 106 is connected to the output of the pwm filter stage 22', the negative feedback can eliminate noise which originates in the power supply 64' and appears on the pwm power signal 20'.

The reference signal 55 which is coupled to the noninverting input of the op amp 126 is produced by the phase shifter 104 by phase shifting the absolute value signal 53', as follows. In the phase shifter 104, the capacitor 120 differentiates the absolute value signal 53'. The differentiated absolute value signal is summed with the absolute value signal 53' at node 144 by resistor 122 to produce the reference signal 55 at the output of the op amp 116. It will be understood by those skilled in the art that the above operation (differentiating and summing) has the effect of phase shifting the reference signal 55 with respect to the audio input signal $V_{in}$. The phase shifted reference signal 55 compensates for the phase shift which is introduced by the LC network in the filter stage 22' and is used to align the output of the pwm filter 22' with the audio signal input $V_{in}$ thereby eliminating the need for the time delay stage 44 (FIG. 2). By eliminating the time delay stage 44 in the audio signal feed path for the bridge amplifier 26', a restriction on the bandwidth performance of the amplifier 100 is also eliminated.

As shown in FIG. 4, the reference signal 55 is fed to the proportional integral controller 106 through the divider 114. The divider 114 is coupled to the over-current protection circuit 110 and the over-temperature protection circuit 112.

The principle function of the divider 114 is to reduce the reference signal 55 (and therefore the current flowing in the output transistors $V_1$ to $V_4$) in response to a over-current and/or over-temperature condition. The divider 114 comprises the resistor 128 which is coupled to the voltage controlled resistor (i.e. VCR) 130. The VCR 130 can be implemented using, a Junction Field Effect Transistor or JFET for example. The control input of the VCR 130 (i.e. gate of the JFET) is coupled and responsive to both the over-current protection and over-temperature protection circuits 110,112 as will now be described. There is an advantage in positioning the divider 114 after the absolute value stage 52', in that, the divider 114 does not have to be double-ended (since the input signal $V_{in}$ has been rectified). A double-ended divider (not shown) could be implemented in a transconductance amplifier for example, and positioned before the absolute stage 52'.

The over-current protection circuit 110 includes an averaging network 146 and a peak detector network 148. The averaging and peak detector networks 146,148 are connected to an output line 150 from the power gain stage 50'. The output line 150 supplies the over-current circuit 110 with a current signal which is sensed in the power gain stage 50' and corresponds to the output current being supplied by the output transistors $V_1$ to $V_4$. As shown in FIG. 4, the outputs of the averaging and peak detector networks 146, 148 are diode "or'd" through a pair of diodes 152,154 and coupled to the divider 114 through a zener diode 156.

The averaging network 146 in the over-current circuit 110 comprises a resistor 158 and an averaging capacitor 160. In operation, the resistor 158 and capacitor 160 produce a signal which is proportional to the average of the output current in the power gain stage 50'. The peak detector network 148 comprises a pair of resistors 162,164 which form a resistive divider and provide a very fast peak detect response. This is important for certain fault conditions, such as a dead-short. The resistive divider scales the input current signal so that the peak value and average value are the same for a sinusoidal current. The peak and average values are then diode "or'd" by the diodes 152,154 and coupled to the zener diode 156. The function of the zener diode 156 is to provide a threshold level the over-current condition. The value of the zener diode 156 can be selected to provide a threshold which represents 200 watts into 2 ohms, for example. If the average or peak value of the output current exceeds the threshold level, then the zener diode 156 will conduct. This in turn causes the voltage controlled resistor 130 to proportionately reduce its resistance. A drop in the resistance of the VCR 130 will attenuate the reference signal 55 thereby decreasing the output of the pwm filter 22' and the "headroom" in the power gain stage 50'. Decreasing the headroom has the effect of reducing the stress on the output transistors $V_1$ to $V_4$ without clipping the output signal 36.

Referring still to FIG. 4, the over-temperature protection circuit 112 is also coupled to the VCR 130 and in response to an over-temperature condition will proportionately reduce the resistance to attenuate the reference signal 55. The over-temperature circuit 112 comprises a negative coefficient thermistor 166, a resistor 168 and another zener diode 170. The zener diode 170 provides the threshold level for the over-temperature condition. The input (i.e. sensing) terminal of the thermistor 166 is attached to directly to one of the output transistors, e.g. $V_1$, in the power gain stage 50', as indicated in FIG. 4. The other terminal of the thermistor 166 is connected to the resistor 168 and the cathode of the zener diode 170. The thermistor 166 and resistor 168 form a resistive divider which produces a voltage across the zener diode 170 that varies with the temperature of the output transistor $V_1$. As the temperature increases, the voltage at the cathode of the zener 170 (i.e. node 172) will also increase. When the voltage at node 172 exceeds the zener voltage (i.e. over-temperature threshold), the zener diode 170 will conduct and the voltage at node 172 is applied to the VCR 130 causing a proportional decrease in the resistance. The decrease in resistance of the VCR 130 attenuates the reference signal 55 thereby reducing the output current flowing in the transistors $V_1$ to $V_4$.

As shown in FIG. 4, the over-temperature protection circuit 112 can also include an output line 167 for shutting off the amplifier 100 when the temperature exceeds a maximum value. The maximum value can be set using a Schmidt trigger buffer 169 which couples the output line 167 to the amplifier's 100 power on/off logic indicated by block 171.

Referring back to FIG. 3, at high frequencies, the capacitor in the pwm filter stage 22' will not be able to track the pulse width modulated input signal. Therefore the pwm filter 22' will produce an average power signal (not shown) which instead of tracking the input signal $V_{in}$ represents the average value of the input signal $V_{in}$. To compensate for this effect, the control circuit 14' in the improved amplifier 100 includes the peak detector stage 108. As shown in FIG. 3, the peak detector 108 is coupled to the output of the absolute value stage 52'. The peak detector 108 is designed to have a very fast decay rate (as will be described with reference to FIG. 4 below). The very fast decay rate results in the peak detector 108 operating as an absolute value detector at low frequencies, while at high frequencies, the peak detector 108 functions as a peak detector. The effect of the peak detector 108 is that the reference signal 55 will track the peak value of the input signal $V_{in}$ at high frequencies. This causes the amplifier 100 to revert to Class AB operation, which as will be appreciated by those skilled in the art is a desirable trade-off for high frequency performance of a Class D amplifier.

The peak detector stage 108 is shown in detail in FIG. 4. The peak detector comprises a capacitor 174 and a resistor 176. The capacitor 174 and resistor 176 are coupled to the output of the absolute value stage 52' through a diode 178. In operation, the capacitor 174 will charge to a voltage corresponding to the peak value of the absolute value 53' of the input signal $V_{in}$. Once the capacitor 174 is charged to the peak value, the diode 178 will turn off and prevent further charging of the capacitor 174. (With the diode 178 turned off, the capacitor 174 will discharge through the resistor 176 according to the time constant formed from the resistance and capacitance.) When the input signal $V_{in}$ exceeds the stored peak value, the diode 178 is forwarded biased and the capacitor 174 is charged to a new peak value. The values for the resistor 176 and capacitor 174 are selected to provide a time constant of 50 microseconds. The relationship between the various waveforms associated with the peak detector 108 is shown in FIG. 5.

Figure 5:
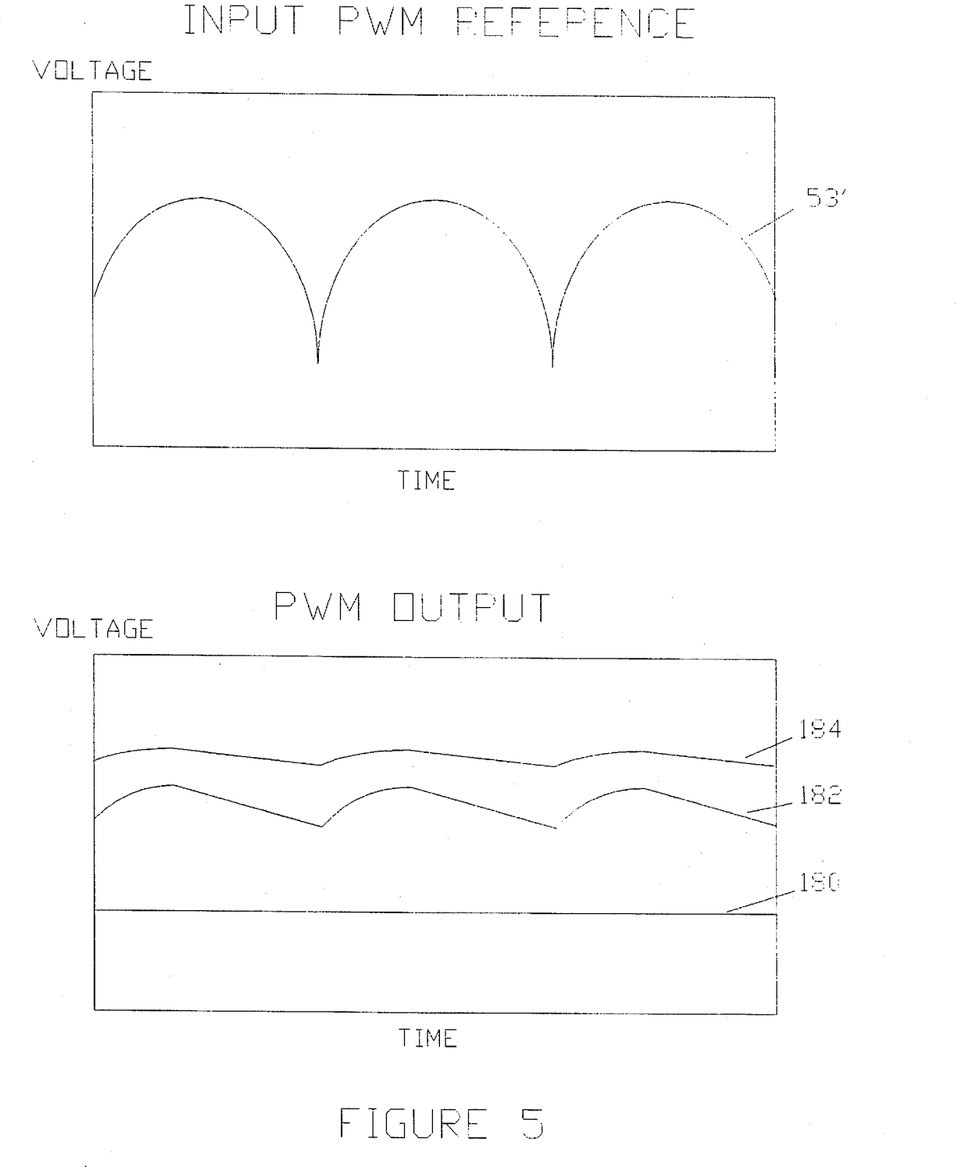
FIG. 5 shows waveforms for the pulse width modulator and the peak detector circuits of FIG. 4.

In FIG. 5, the pwm filter 22' will produce an output signal 180 which in the absence of the peak detector 108 will represent the average of the absolute value signal 53' at high frequencies. With the addition of the peak detector 108, the reference signal 55 is modified to follow the peaks of the absolute value signal 53' as indicated by reference 182. This results in the pwm filter 22' producing a compensated output signal 184 which follows the peaks and causes to the amplifier 100 to revert to operation as a Class AB amplifier. It will be appreciated that reverting to Class AB operation at high frequencies presents a good trade-off in terms of performance for the amplifier 100.

It will be evident to those skilled in the art that other embodiments of the invention fall within its spirit and scope as defined by the following claims.

I claim:

1. An amplifier for amplifying an input signal, said amplifier comprising:

(a) first, second, third and fourth amplifier means each having first and second power terminals and a control terminal;

said amplifier means being connected in a bridge configuration, said first and second amplifier means each having their first power terminals coupled together and to a first power input terminal, said third and fourth amplifier means each having their first power terminals coupled together and to a second power input terminal;

(c) the second power terminals of said first and third amplifier means being coupled together and to a first output terminal, the second power terminals of said second and fourth amplifier means being coupled together and to a second output terminal, said first and second output terminals being adapted to being connected to a load;

(d) an input terminal for said input signal, and a control circuit coupled between said input terminal and said control terminals of said first to fourth amplifier means to operate alternately said first and third amplifier means and then said second and fourth amplifier means, to direct current from said first power input terminal through said first amplifier means, said first output terminal, said load, said second output terminal, said fourth amplifier means and said second power input terminal, and then to direct current from said first power input terminal through said second amplifier means, said second output terminal, said load, said first output terminal, said third amplifier means and said second power input terminal;

(e) modulating means coupled to said input terminal for producing a modulated signal having modulation dependent on said input signal;

(f) power supply means, and filter means for said power supply means;

(g) switch means having a control input, said switch means coupling said power supply means to said filter means, said filter means being coupled to said first and second power input terminals;

(h) said modulating means being coupled to said control input of said switch means for controlling said switch means to produce at said power input terminals a power signal dependent on said input signal; and (i) said modulating means including means for producing a power control signal for controlling said switch means and phase shifter means for phase shifting said power control signal so that said power signal is shifted for alignment with said input signal.

2. The amplifier as claimed in claim 1, further including feedback control means coupled to said filter means and to said modulating means and having means responsive to said phase shifted power control signal and said power signal for producing an error signal for controlling said switch means to produce at said power input terminals a corrected power signal.

3. The amplifier as claimed in claim 1 further including overload current protection means comprising: (a) sensor means coupled to said amplifier means for sensing the current flowing in the amplifier means; (b) averaging means for producing an output signal corresponding to the average value of said sensed current; (c) peak detector means for producing an output signal corresponding to the peak value for said sensed current; (d) said averaging means including threshold means for producing a current overload signal when said averaged output signal exceeds a first pre-determined threshold; (e) said peak detector means including said threshold means for producing said current overload signal when said peak output signal exceeds a second pre-determined threshold; and (f) divider means coupled to said modulating means for proportionately reducing said power control signal in response to said current overload signal.

4. The amplifier as claimed in claim 1, further including thermal overload protection means comprising: (a) a temperature sensor coupled to one of said amplifier means and having means for producing a temperature output signal in response to a change in temperature in said amplifier means; (b) means coupled to said temperature sensor for producing a thermal protection signal when said temperature output signal exceeds a first pre-determined threshold; and (c) divider means coupled to said modulating means and having means responsive to said thermal protection signal for proportionately reducing the magnitude of said power control signal.

5. The amplifier as claimed in claim 1, wherein said modulating means further includes a compensator coupled to said input terminal and having means responsive to said input signal having a frequency in a selected range for producing a frequency compensated power control signal for controlling said filter means.

6. The amplifier as claimed in claim 2, wherein said modulating means further includes a compensator coupled to said input terminal and having means responsive to said input signal having a frequency in a selected range for producing a frequency compensated power control signal for controlling said filter means.

7. The amplifier claimed in claim 1, wherein said means for producing a power control signal comprises absolute value means coupled to said input terminal, and said power control signal is an absolute value signal having an absolute value proportional to the absolute value of said input signal.

8. The amplifier claimed in claim 2, wherein said means for producing a power control signal comprises absolute value means coupled to said input terminal, and said power control signal is an absolute value signal having an absolute value proportional to the absolute value of said input signal.

9. The amplifier as claimed in claim 7 or 8, wherein said phase shifter means includes an input coupled to said absolute value means for accepting said absolute value signal, and summing and differentiating means coupled to said input for phase shifting said absolute value signal to produce said phase shifted power control signal at an output.

10. The amplifier as claimed in claim 2, wherein said feedback control means includes a differential amplifier having an input coupled to said phase shifter means for receiving said phase shifted power control signal and another input coupled to said filter means for receiving said power signal, and said differential amplifier including means for comparing said power signal and said phase shifted power control signal and producing said error signal at an output coupled to said switch means.

11. The amplifier as claimed in claim 4, wherein said thermal overload protection means includes means for shutting down the amplifier when said thermal protection signal exceeds a second predetermined threshold.

12. The amplifier as claimed in claim 4 or 11, wherein said temperature sensor comprises a negative coefficient thermistor.

13. The amplifier as claimed in claim 5 or 6, wherein said compensator comprises a peak detector circuit having a time constant adapted to compensate for high frequency averaging in said filter.

14. An amplifier for amplifying an input signal, said amplifier comprising:
(a) first, second, third and fourth amplifier means each having first and second power terminals and a control terminal;
(b) said amplifier means being connected in a bridge configuration, said first and second amplifier means each having their first power terminals coupled together and to a first power input terminal, said third and fourth amplifier means each having their first power terminals coupled together and to a second power input terminal;
(c) the second power terminals of said first and third amplifier means being coupled together and to a first output terminal, the second power terminals of said second and fourth amplifier means being coupled together and to a second output terminal, said first and second output terminals being adapted to being connected to a load;
(d) an input terminal for said input signal, and a control circuit coupled between said input terminal and said control terminals of said first to fourth amplifier means to operate alternately said first and third amplifier means and then said second and fourth amplifier means, to direct current from said first power input terminal through said first amplifier means, said first output terminal, said load, said second output terminal, said fourth amplifier means and said second power input terminal, and then to direct current from said first power input terminal through said second amplifier means, said second output terminal, said load, said first output terminal, said third amplifier means and said second power input terminal;
(e) modulating means coupled to said input terminal for producing a modulated signal having modulation dependent on said input signal;
(f) power supply means, and filter means for said power supply means;
(g) switch means having a control input, said switch means coupling said power supply means to said filter means, said filter means being coupled to said first and second power input terminals;
(h) said modulating means being coupled to said control input of said switch means for controlling said switch means to produce at said power input terminals a power signal dependent on said input signal; and
(i) overload current protection means including sensor means coupled to one of said amplifier means for sensing the current flowing in said amplifier means, said sensor means comprising averaging means for producing an output signal corresponding to the average value of said sensed current and peak detector means for producing an output signal corresponding to the peak value for said sensed current, and said averaging means including threshold means for producing a current overload signal when said averaged output signal exceeds a first pre-determined threshold, and said peak detector means including said threshold means for producing a current overload signal when said peak output signal exceeds a second pre-determined threshold, and divider means coupled to said modulating means for proportionately reducing said power control signal in response to said current overload signal.

15. The amplifier as claimed in claim 14, wherein said averaging means comprises a resistor having one terminal connected to an input for receiving said sensed current and another terminal connected to a capacitor for averaging said sensed current to produce said output signal corresponding to the average value of said sensed current.

16. The amplifier as claimed in claim 14 or 15, wherein said peak detector means comprises a resistive divider having an input for receiving said sensed current and means for producing an output signal corresponding to a scaled peak value of said sensed current.

17. An amplifier for amplifying an input signal, said amplifier comprising:
  (a) first, second, third and fourth amplifier means each having first and second power terminals and a control terminal;
  (b) said amplifier means being connected in a bridge configuration, said first and second amplifier means each having their first power terminals coupled together and to a first power input terminal, said third and fourth amplifier means each having their first power terminals coupled together and to a second power input terminal;
  (c) the second power terminals of said first and third amplifier means being coupled together and to a first output terminal, the second power terminals of said second and fourth amplifier means being coupled together and to a second output terminal, said first and second output terminals being adapted to being connected to a load;
  (d) an input terminal for said input signal, and a control circuit coupled between said input terminal and said control terminals of said first to fourth amplifier means to operate alternately said first and third amplifier means and then said second and fourth amplifier means, to direct current from said first power input terminal through said first amplifier means, said first output terminal, said load, said second output terminal, said fourth amplifier means and said second power input terminal, and then to direct current from said first power input terminal through said second amplifier means, said second output terminal, said load, said first output terminal, said third amplifier means and said second power input terminal;
  (e) modulating means coupled to said input terminal for producing a modulated signal having modulation dependent on said input signal;
  (f) power supply means, and filter means for said power supply means;
  (g) switch means having a control input, said switch means coupling said power supply means to said filter means, said filter means being coupled to said first and second power input terminals;
  (h) said modulating means being coupled to said control input of said switch means for controlling said switch means to produce at said power input terminals a power signal dependent on said input signal; and
  (i) thermal overload protection means having a temperature sensor coupled to one of said amplifier means and having means for producing a temperature output signal in response to a change in temperature in said amplifier means, and means coupled to said temperature sensor for producing a thermal protection signal when said temperature output signal exceeds a first pre-determined threshold, and divider means coupled to said modulating means and including means responsive to said thermal protection signal for proportionately reducing the magnitude of said power control signal.

18. The amplifier as claimed in claim 17, wherein said thermal overload protection means includes means for shutting down the amplifier when said thermal protection signal exceeds a second predetermined threshold.

19. The amplifier as claimed in claim 18, wherein said temperature sensor comprises a negative coefficient thermistor.

20. The amplifier as claimed in claim 17, 18 or 19, further including overload current protection means comprising: (a) sensor means coupled to the amplifier means for sensing the current flowing in the amplifier means; (b) averaging means for producing an output signal corresponding to the average value of said sensed current; (c) peak detector means for producing an output signal corresponding to the peak value for said sensed current; (d) said averaging means including threshold means for producing a current overload signal when said averaged output signal exceeds a first pre-determined threshold; (e) said peak detector means including said threshold means for producing said current overload signal when said peak output signal exceeds a second pre-determined threshold; and (f) divider means coupled to said modulating means for proportionately reducing said power control signal in response to said current overload signal.

* * * * *